United States Patent
Schilling

(10) Patent No.: US 7,663,421 B2
(45) Date of Patent: Feb. 16, 2010

(54) METHOD FOR DETERMINING A SWITCH-ON THRESHOLD AND ELECTRONIC CIRCUIT ARRANGEMENT FOR CARRYING OUT THE METHOD

(75) Inventor: Robert Schilling, Niederrohrdorf (CH)

(73) Assignee: ABB Technology AG, Zurich (CH)

( * ) Notice: Subject to any disclaimer, the term of this patent is extended or adjusted under 35 U.S.C. 154(b) by 172 days.

(21) Appl. No.: 11/902,348

(22) Filed: Sep. 20, 2007

(65) Prior Publication Data

US 2008/0284485 A1 Nov. 20, 2008

(30) Foreign Application Priority Data

Sep. 28, 2006 (EP) .................................. 06405407

(51) Int. Cl.
*H03L 5/00* (2006.01)
(52) U.S. Cl. .............................. 327/333; 326/62; 326/81
(58) Field of Classification Search ............. 326/62–63, 326/80–81; 327/306, 333
See application file for complete search history.

(56) References Cited

U.S. PATENT DOCUMENTS

| 4,523,143 | A | 6/1985 | Dvorak | |
|---|---|---|---|---|
| 6,211,719 | B1 * | 4/2001 | deBrigard | 327/379 |
| 6,351,172 | B1 * | 2/2002 | Ouyang et al. | 327/333 |
| 6,420,910 | B1 | 7/2002 | Contreras et al. | |
| 7,176,709 | B2 * | 2/2007 | Uematsu | 326/30 |
| 7,307,458 | B1 * | 12/2007 | Segervall et al. | 327/108 |
| 2002/0083352 | A1 | 6/2002 | Fujimoto | |

FOREIGN PATENT DOCUMENTS

EP 0 461 627 A1 12/1991

OTHER PUBLICATIONS

European Search Report.

* cited by examiner

*Primary Examiner*—Dinh T. Le
(74) *Attorney, Agent, or Firm*—Buchanan Ingersoll & Rooney PC

(57) ABSTRACT

An electronic circuit arrangement is disclosed for converting an input voltage signal having a first voltage level into an output signal having a second voltage level. An input unit is provided for inputting the input voltage signal at the first voltage level, while an output unit is arranged for outputting the output signal at the output of the electronic circuit arrangement. A threshold value comparison unit serves for comparing the first voltage level of the input signal with a switch-on threshold value. The circuit arrangement furthermore contains an input impedance changeover unit for changing over an input impedance of the circuit arrangement from a low value to a high value after a predetermined delay duration after the first voltage level of the input voltage signal exceeded the switch-on threshold value.

15 Claims, 1 Drawing Sheet

METHOD FOR DETERMINING A SWITCH-ON THRESHOLD AND ELECTRONIC CIRCUIT ARRANGEMENT FOR CARRYING OUT THE METHOD

RELATED APPLICATIONS

This application claims priority under 35 U.S.C. §119 to EP Application 06405407.5 filed in Europe on Sep. 28, 2006, the entire contents of which are hereby incorporated by reference in their entireties.

TECHNICAL FIELD

Electronic circuit arrangements are disclosed for converting input signals into output signals, e.g., an electronic circuit arrangement into which is input a digital input signal which changes over into a digital output signal upon reaching a specific switching threshold.

Specifically, the present disclosure relates to an electronic circuit arrangement for converting an input voltage signal having a first voltage level into an output voltage signal having a second voltage level, provision being made of an input unit for inputting the input voltage signal at the first voltage level, a threshold value comparison unit for comparing the first voltage level of the input signal with a switch-on threshold value, and an output unit for outputting the output signal depending on the comparison of the first voltage level of the input voltage signal with the switch-on threshold value.

BACKGROUND INFORMATION

Electronic circuit arrangements for converting an input voltage signal having a first voltage level into an output voltage signal having a second voltage level are known. Conventional electronic circuit arrangements of this type permit input voltage signals having a wide input voltage range of 80 V to 300 V, for example, to be converted into corresponding output voltage signals. In order that the electronic circuit arrangement can process voltage signals having such a wide input voltage range, the input of the electronic circuit arrangement must have a high-impedance input, that is to say that the electronic circuit arrangement must have a high input impedance relative to the input voltage signal to be processed or to be amplified.

The solution proposed in the prior art for processing input voltage signals in a wide input voltage range has numerous disadvantages, however. One essential disadvantage of conventional circuit arrangements is that high input impedances result in the circuit arrangement having a high susceptibility to interference. High-impedance inputs are extremely sensitive in particular toward crosstalk between channels, cross-modulation effects, noise and interference induced by electrical and magnetic fields.

In many cases, however, it is absolutely necessary to identify without interference a change in a level of an input voltage signal to be processed, for example when a switch-on instant is to be detected precisely. This is of great importance particularly when detecting digital or binary signals. Such digital or binary signals, too, can have a large input voltage range, as specified above, in different applications.

In order to improve the interference immunity of conventional electronic circuit arrangements, it has been proposed in the prior art to reduce the input impedance of such electronic circuit arrangements. This leads to high currents and thus to high power losses in an inexpedient manner in the case of the input voltage ranges considered (80 V-300 V). Although the reduction of the input impedance lessens somewhat the sensitivity to the abovementioned disturbing interference, such as, for example, crosstalk, cross-modulation, noise components, interference induced by electrical or magnetic fields, and the problem associated with electromagnetic compatibility, the increase in the power loss on account of the increased input current at a lower input impedance cannot be tolerated for many applications.

SUMMARY

It is an object of the present disclosure, therefore, to provide an electronic circuit arrangement for converting an input voltage signal into an output voltage signal for a large input voltage range, which circuit arrangement is insensitive toward interference of the input voltage signal.

An electronic circuit arrangement is disclosed for converting an input voltage signal having a first voltage level into an output signal having a second voltage level.

One aspect of the disclosure relates to changing over the input impedance of an electronic circuit arrangement in such a way that a switch-on instant can be detected without interference, and that a high power loss due to an excessively high input current is at the same time avoided. An excessively high input current is avoided by changing over the input impedance at a further instant, which lies after a delay time duration after the switch-on instant.

Consequently, it is advantageous that a low input impedance of the electronic circuit arrangement can be provided at the switch-on instant, while at a later instant, that is to say after a reliable switch-on not influenced by interference, a high input impedance into the electronic circuit arrangement can be provided, with the result that, after a reliable switch-on, an input current does not rise excessively and an increase in a power loss can thus be avoided.

An exemplary electronic circuit arrangement according to the disclosure for converting an input voltage signal having a first voltage level into an output signal having a second voltage level can have:

a) an input unit for inputting the input voltage signal at the first voltage level;
b) a threshold value comparison unit for comparing the first voltage level of the input voltage signal with a switch-on threshold value; and
c) an output unit for outputting the output signal depending on the comparison of the first voltage level of the input voltage signal with the switch-on threshold value,
d) provision being made of an input impedance changeover unit for changing over an input impedance of the circuit arrangement from a low value to a high value after a predetermined delay time duration (411) after an instant (410) at which the first voltage level of the input voltage signal (101) exceeded the switch-on threshold value (404).

Furthermore, the method according to the disclosure for converting an input voltage signal having a first voltage level into an output signal having a second voltage level can have the following steps:

a) inputting of the input voltage signal at the first voltage level by means of an input unit;
b) comparison of the first voltage level of the input voltage signal with a switch-on threshold value by means of a threshold value comparison unit; and
c) outputting of the output signal depending on the comparison of the first voltage level of the input voltage signal with the switch-on threshold value by means of an output unit,
d) an input impedance of the circuit arrangement being changed over from a low value to a high value after a predetermined delay time duration (411) after an instant (410) at which the first voltage level of the input voltage signal (101) exceeded the switch-on threshold value (404).

In accordance with one exemplary embodiment of the present disclosure, a triggering unit is provided, which feeds a changeover signal for changing over the input impedance of the circuit arrangement from a low value to a high value, if the first voltage level of the input voltage signal exceeds the switch-on threshold value, after a predetermined delay time duration to the input impedance changeover unit.

In accordance with a further exemplary embodiment of the present disclosure, a primary-side circuit device and a secondary-side circuit device are provided, which are coupled via a coupler device. In this case, the primary-side circuit device contains the input impedance changeover unit for changing over the input impedance of the circuit arrangement. The coupler device can be formed as a magnetic coupler. For example, the coupler device is formed as an optocoupler.

In accordance with yet another exemplary embodiment of the present disclosure, the threshold value comparison unit has a switching hysteresis in such a way that a switch-off threshold value lies below a switch-on threshold value in terms of voltage.

In accordance with yet another exemplary embodiment of the present disclosure, the input impedance of the circuit arrangement has a low value as long as the first voltage level of the input voltage signal is less than the switch-on threshold value. Expediently, the input impedance of the circuit arrangement has a high value if the first voltage level of the input voltage signal exceeds the switch-on threshold value.

In accordance with yet another exemplary embodiment of the present disclosure, the input impedance changeover unit changes over the input impedance of the circuit arrangement from a low value to a high value at a switch-on instant if the first voltage level of the input voltage signal exceeds the switch-on threshold value.

The input impedance of the circuit arrangement can be changed over from a high value to a low value at a changeover instant, after a delay time duration has elapsed after the switch-on instant, if the first voltage level of the input voltage signal exceeded the switch-on threshold value.

In accordance with yet another exemplary embodiment of the present disclosure, the output signal is changed over at the changeover instant, after a delay time duration has elapsed after the switch-on instant, if the first voltage level of the input voltage signal exceeded the switch-on threshold value.

Advantageously, an input current into the circuit arrangement assumes a higher current value during the delay time duration, from the switch-on instant to the changeover instant, than after the changeover instant.

In this way, the exemplary electronic circuit arrangement according to the disclosure for converting an input voltage signal into an output signal and the corresponding conversion method make it possible to define a switch-on instant precisely without the influence of interference, an increase in a power loss being avoided.

BRIEF DESCRIPTION OF THE DRAWINGS

Exemplary embodiments of the invention are illustrated in the drawings and are explained in more detail in the description below.

In the drawings.

In the figures, identical reference symbols designate identical or functionally identical components or steps.

DETAILED DESCRIPTION

Figure 1:
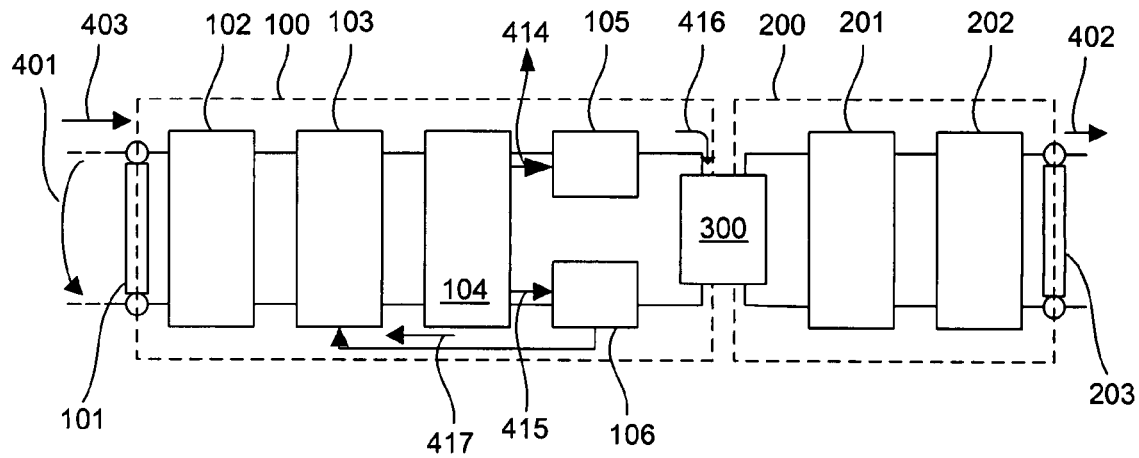
FIG. 1 shows a block diagram of an electronic circuit arrangement for converting an input voltage signal into an output signal in accordance with one exemplary embodiment of the present disclosure.

FIG. 1 shows a schematic block diagram of an electronic circuit arrangement for converting an input voltage signal into an output signal in accordance with one exemplary embodiment of the present disclosure. As shown in FIG. 1, a primary-side circuit device 100 is connected to a secondary-side circuit device 200 via a coupler device 300.

The coupler device 300 may be formed as an optocoupler or as a GMR coupler (Giant Magnetic Resistance coupler). An input voltage signal 401 to be processed is applied to the primary-side circuit device 100, said input voltage signal leading to an input current 403 into the circuit arrangement. An input unit 101 serves for inputting the input voltage signal 401 and the input current 403.

The input signals are firstly fed to a primary-side filter unit 102, which filters out coarse interference of the input voltage signal. An exemplary element of the electronic circuit arrangement according to the disclosure is an input impedance changeover unit, which is designated by the reference symbol 103. A changeover signal 417 is fed to the input impedance changeover unit by a triggering unit 106, which will be described below.

According to the changeover signal 417, in the input impedance changeover unit 103 the input impedance of the electronic circuit arrangement, that is to say an input impedance that is seen upon the inputting of an input voltage signal 401 and an input current 403 into the input unit 101, is changed over from a low input impedance value to a high input impedance value, and vice versa.

It should be pointed out that a low input impedance value is required when a level change in an input voltage signal is to be detected with the least possible influence of external interference, while a high value of the input impedance is required when the input current 403 flowing into the circuit arrangement is to be limited and an excessive power loss is thus to be avoided.

A threshold value comparison unit 104 is connected downstream of the input impedance changeover unit 103. As will be explained below with reference to FIG. 2(a), in the threshold value comparison unit 104 the input voltage signal 401 is compared both with a switch-on threshold value 404 in the case where the output signal 402 is switched on, and with a switch-off threshold value 405 in the case where the output signal 402 is switched off.

A current source 105 connected downstream of the threshold value comparison unit 104 is controlled by means of a current source control signal, which current source feeds a current as a transfer signal 416 to the coupler device 300. Furthermore, the triggering unit 106 is connected downstream of the threshold value comparison unit 104, which triggering unit is addressed by the threshold value comparison unit 104 by means of a triggering unit control signal 415. The switch-on operations, changeover operations and switch-off operations and also the corresponding delay times are explained below with reference to FIGS. 2(a), 2(b) and 2(c).

The secondary-side circuit device 200 shown in FIG. 1 has a secondary-side filter unit 201 for filtering the electrical signal output from the coupler device 300, and a control unit 202. The control unit 202 processes the signal received from the primary-side circuit device 100 via the coupler device 200 and outputs an output signal 402 via an output unit 203, said output signal being illustrated below in FIG. 2(b).

Figure 2:
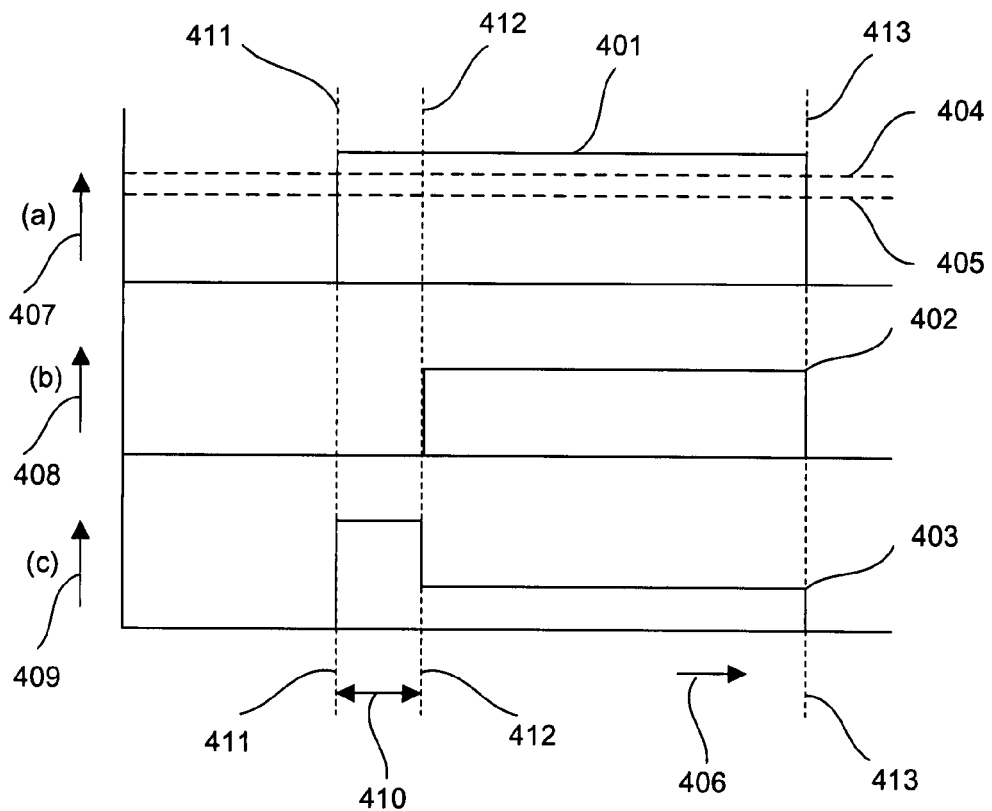
FIG. 2 shows a timing diagram for illustrating input signals and output signals relating to the circuit arrangement shown in FIG. 1, in accordance with one exemplary embodiment of the present disclosure.

The function of the electronic circuit arrangement for converting an input voltage signal having a first voltage level into an output signal having a second voltage level will now be explained with reference to FIGS. 2(a), 2(b) and 2(c). FIG. 2 illustrates overall a timing diagram, profiles against a time 406 of an input voltage value 407, of an output voltage value 408 and of an input current value 409 being illustrated one below another in a temporally correlated manner.

FIG. 2(a) shows the input voltage value 407 as a function of the time 406, the abovementioned switch-on and switch-off threshold values 404 and 405 simultaneously being depicted in FIG. 2(a) (dashed horizontal lines).

It should be pointed out that the voltage and current profiles shown in FIGS. 2(a)-(c) are only an example for elucidating the basic functional principle of the present disclosure.

At a switch-on instant designated by the reference symbol 411, a transition of the input voltage signal from a zero level to a first voltage level takes place.

This transition from a zero level to the first voltage level in the input voltage signal 401 is intended to have the effect that the output signal 402 (see FIG. 2(b)) likewise rises from a zero level to a second voltage level. As can be seen in FIG. 2, however, such a rise takes place only after a delay time duration 410, which can be set in the threshold value comparison unit 104. The delay time duration 410 is the temporal distance between a changeover instant 412 and the switch-on instant 411. As shown above with reference to FIG. 1, the triggering unit 106 provides a feedback to the threshold value comparison unit 104, in such a way that the changeover signal 417 is fed to said threshold value comparison unit.

While the input impedance changeover unit 103 has a low input impedance value at the switch-on instant 410, said value is changed over to a high input impedance value at the changeover instant 412. The threshold value comparison unit 104 drives the current source 105 by means of the current source control signal, said current source having the effect that a transfer signal 416 is transmitted through the coupler device 300, which signal then leads on the secondary side to a rise, from a zero level to the second voltage level, of the output signal 402.

The consequence is that, as shown in FIG. 2(b), the output signal 402 follows the voltage profile of the input voltage signal 401 only after a delay time duration 410 after the switch-on instant 411. The essential advantage of such a changeover method consists in the fact that, during the delay time duration 410, interference present at, for example, the input unit 101 of the electronic circuit arrangement has no influence on the changeover instant.

The reason for this is the fact that the electronic circuit arrangement has a low value of the input impedance in the time between the switch-on instant 411 and the changeover instant 412, here a high input current 403 flowing into the circuit arrangement, as shown in the lower profile in FIG. 2, i.e. in FIG. 2(c).

Said high input current 403 is reduced to a low current (typically 1 mA) at the changeover instant 412, such that the power loss of the circuit arrangement cannot exceed a permissible maximum value.

Furthermore, FIGS. 2(a)-(c) show a switch-off instant 413, which represents the switch-off of the input voltage signal 401 from the first voltage level to the zero level. It should be pointed out that the input impedance of the electronic circuit arrangement assumes a high value at the switch-off instant since a changeover from a high input impedance value to a low input impedance value has already been effected at the changeover instant 412. This is unimportant with regard to the input interference, however, since a low-impedance termination of the input unit 101 is provided anyway when switching off the input voltage signal 401.

Consequently, it is possible to detect a switch-on of an input voltage signal 401 without interference and with high reliability, without the power loss of the entire electronic circuit arrangement being excessively increased.

The input impedance changeover unit can contain field effect transistors (FET) which are turned on in the case of a control current. The peak value—shown in FIG. 2(c)—of the input current 403 during the delay time duration 410 may be a few amperes, while the current value of the rest of the input current profile 403 is only a few milliamperes (mA).

Although the present disclosure has been described above on the basis of exemplary embodiments, it is not restricted thereto, but rather can be modified in diverse ways.

Moreover, the invention is not restricted to the application possibilities mentioned.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE SYMBOLS

In the figures, identical reference symbols designate identical or functionally identical components or steps.

100 Primary-side circuit device
101 Input unit
102 Primary-side filter unit
103 Input impedance changeover unit
104 Threshold value comparison unit
105 Current source
106 Triggering unit
200 Secondary-side circuit device
201 Secondary-side filter unit
202 Control unit
203 Output unit
300 Coupler device
401 Input voltage signal
402 Output signal
403 Input current
404 Switch-on threshold value
405 Switch-off threshold value
406 Time
407 Input voltage value
408 Output voltage value
409 Input current value
410 Delay time duration
411 Switch-on instant
412 Changeover instant
413 Switch-off instant
414 Current source control signal
415 Triggering unit control signal
416 Transfer signal
417 Changeover signal

What is claimed is:

1. An electronic circuit arrangement for converting an input voltage signal having a first voltage level into an output signal having a second voltage level, comprising:
   a) an input unit configured to input an input voltage signal at the first voltage level;
   b) a threshold value comparison unit configured to compare the first voltage level of the input voltage signal with a switch-on threshold value;
   c) an output unit configured to output the output signal depending on the comparison of the first voltage level of the input voltage signal with the switch-on threshold value; and
   d) an input impedance changeover unit configured to change an input impedance of the input unit from a low value to a high value after a predetermined delay time duration has elapsed after an instant at which the first voltage level of the input voltage signal exceeds the switch-on threshold value.

2. The circuit arrangement as claimed in claim 1, comprising a triggering unit configured to output a changeover signal that causes the input impedance changeover unit to change the input impedance from the low value to the high value after the elapsing of the predetermined delay time duration.

3. The circuit arrangement as claimed in claim 1, comprising:
   a primary-side circuit device;
   a secondary-side circuit device; and
   a coupler device coupled between the primary-side circuit device and the secondary-side circuit device, wherein the primary-side circuit device comprises the input unit, the threshold value comparison unit, and the input impedance changeover unit, and the secondary-side circuit device comprises the output unit.

4. The circuit arrangement as claimed in claim 3, wherein the coupler device comprises an optocoupler.

5. The circuit arrangement as claimed in claim 3, wherein the coupler device comprises a magnetic coupler.

6. The circuit arrangement as claimed in claim 1, wherein the threshold value comparison unit has a switching hysteresis.

7. The circuit arrangement as claimed in claim 1, comprising a filter unit coupled between the input unit and the input impedance changeover unit, wherein the filter unit is configured to filter the input voltage signal and feed the filtered voltage signal to the threshold value comparison unit.

8. A method for converting an input voltage signal having a first voltage level into an output signal having a second voltage level, comprising the following steps:
   a) inputting the input voltage signal at the first voltage level by means of an input unit;
   b) comparing the first voltage level of the input voltage signal with a switch-on threshold value by means of a threshold value comparison unit;
   c) outputting, by means of an output unit, the output signal depending on the comparison of the first voltage level of the input voltage signal with the switch-on threshold value; and
   d) changing over an input impedance of the input unit from a low value to a high value after a predetermined delay time duration has elapsed after an instant at which the first voltage level of the input voltage signal exceeds the switch-on threshold value.

9. The method as claimed in claim 8, wherein the input impedance of the input unit has the low value as long as the first voltage level of the input voltage signal is less than the switch-on threshold value.

10. The method as claimed in claim 8, wherein the input impedance of the input unit has the high value if the first voltage level of the input voltage signal exceeds the switch-on threshold value.

11. The method as claimed in claim 8, wherein the input impedance of the input unit is changed from the low value to the high value when the first voltage level of the input voltage signal exceeds the switch-on threshold value.

12. The method as claimed in claim 8, wherein the input impedance of the input unit is changed from the high value to the low value at a changeover instant, which occurs after the delay time duration has elapsed after a switch-on instant, which occurs when the first voltage level of the input voltage signal exceeds the switch-on threshold value.

13. The method as claimed in claim 8, wherein the output signal is changed at a changeover instant, which occurs after the delay time duration has elapsed after the switch-on instant at which the first voltage level of the input voltage signal exceeds the switch-on threshold value.

14. The method as claimed in claim 8, wherein an input current into the input unit assumes a higher current value during the delay time duration, from the switch-on instant to the changeover instant, than after the changeover instant, wherein the switch-on instant occurs when the first voltage level of the input voltage signal exceeds the switch-on threshold value, and the changeover instant occurs after the delay time duration has elapsed after the switch-on instant.

15. A method for voltage conversion, comprising the following steps:
   a) providing an input voltage signal of a first voltage level at an input;
   b) comparing the first voltage level of the input voltage signal with a switch-on threshold value;
   c) providing an output signal based on the comparison of the first voltage level of the input voltage signal with the switch-on threshold value; and
   (d) changing a value of an input impedance of the input if the first voltage level of the input voltage signal exceeds the switch-on threshold value.

* * * * *